United States Patent
Suzuki (10) Patent No.: US 6,441,425 B1
(45) Date of Patent: Aug. 27, 2002

(54) NON-VOLATILE SEMICONDUCTOR DEVICE AND NON-VOLATILE SEMICONDUCTOR MEMORY DEVICE FOR STORING MULTI-VALUE INFORMATION

(75) Inventor: Kazuteru Suzuki, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/685,653

(22) Filed: Oct. 10, 2000

(30) Foreign Application Priority Data

Oct. 8, 1999 (JP) .......................................... 11/287987

(51) Int. Cl.⁷ .............................................. H01L 29/76
(52) U.S. Cl. ...................... 257/314; 257/315; 257/316
(58) Field of Search ................................ 257/315, 316, 257/319, 320, 321, 314, 30, 390, 391, 392

(56) References Cited

U.S. PATENT DOCUMENTS 4,622,656 A * 11/1986 Kamiya et al.
5,231,299 A * 7/1993 Ning et al.
5,554,553 A * 9/1996 Harari

* cited by examiner

*Primary Examiner*—Nathan J. Flynn
*Assistant Examiner*—Kevin Quinto
(74) *Attorney, Agent, or Firm*—Hutchins, Wheeler & Dittmar (57) ABSTRACT

A non-volatile semiconductor device stores multi-value information of at least two bits in one memory cell. A source region and a drain region serve as diffusion regions. A first channel region and a second channel region are placed between the source region and the drain region. A first gate electrode is arranged over the first channel region and the drain region. A second gate electrode is arranged over the second channel region and the source region. The first channel region stores a first threshold value while the second channel region stores a second threshold value different from the first threshold value.

13 Claims, 14 Drawing Sheets

| VTC | FIRST READING OPERATION | SECOND READING OPERATION | THIRD READING OPERATION | OUT DATA |
|---|---|---|---|---|
| VT0 | ○ | ○ | ○ | 00 |
| VT0 | ● | ○ | ○ | 01 |
| VT1 | ● | ● | ○ | 10 |
| VT1 | ● | ● | ● | 11 |

※ ○ JUDGED AS ON  ● JUDGED AS OFF

| CH | R1 | R2 | R3 | R4 | R5 | R6 | R7 | R8 | R9 | RA | RB | RC | RD | RE | RF | OUT DATA |
|---|---|---|---|---|---|---|---|---|---|---|---|---|---|---|---|---|
| VT0 | ○ | ○ | ○ | ○ | ○ | ○ | ○ | ○ | ○ | ○ | ○ | ○ | ○ | ○ | ○ | 0000 |
| VT1 | ● | ○ | ○ | ○ | ○ | ○ | ○ | ○ | ○ | ○ | ○ | ○ | ○ | ○ | ○ | 0001 |
| VT2 | ● | ● | ○ | ○ | ○ | ○ | ○ | ○ | ○ | ○ | ○ | ○ | ○ | ○ | ○ | 0010 |
| VT3 | ● | ● | ● | ○ | ○ | ○ | ○ | ○ | ○ | ○ | ○ | ○ | ○ | ○ | ○ | 0011 |
| VT4 | ● | ● | ● | ● | ○ | ○ | ○ | ○ | ○ | ○ | ○ | ○ | ○ | ○ | ○ | 0100 |
| VT5 | ● | ● | ● | ● | ● | ○ | ○ | ○ | ○ | ○ | ○ | ○ | ○ | ○ | ○ | 0101 |
| VT6 | ● | ● | ● | ● | ● | ● | ○ | ○ | ○ | ○ | ○ | ○ | ○ | ○ | ○ | 0110 |
| VT7 | ● | ● | ● | ● | ● | ● | ● | ○ | ○ | ○ | ○ | ○ | ○ | ○ | ○ | 0111 |
| VT8 | ● | ● | ● | ● | ● | ● | ● | ● | ○ | ○ | ○ | ○ | ○ | ○ | ○ | 1000 |
| VT9 | ● | ● | ● | ● | ● | ● | ● | ● | ● | ○ | ○ | ○ | ○ | ○ | ○ | 1001 |
| VTA | ● | ● | ● | ● | ● | ● | ● | ● | ● | ● | ○ | ○ | ○ | ○ | ○ | 1010 |
| VTB | ● | ● | ● | ● | ● | ● | ● | ● | ● | ● | ● | ○ | ○ | ○ | ○ | 1011 |
| VTC | ● | ● | ● | ● | ● | ● | ● | ● | ● | ● | ● | ● | ○ | ○ | ○ | 1100 |
| VTD | ● | ● | ● | ● | ● | ● | ● | ● | ● | ● | ● | ● | ● | ○ | ○ | 1101 |
| VTE | ● | ● | ● | ● | ● | ● | ● | ● | ● | ● | ● | ● | ● | ● | ○ | 1110 |
| VTF | ● | ● | ● | ● | ● | ● | ● | ● | ● | ● | ● | ● | ● | ● | ● | 1111 |

※ ○ JUDGED AS ON ● JUDGED AS OFF

| VTC | VTC | FIRST READING OPERATION | SECOND READING OPERATION | OUT DATA |
|---|---|---|---|---|
| VT0 | VT0 | ○ | ○ | 00 |
| VT0 | VT1 | ● | ○ | 01 |
| VT1 | VT0 | ○ | ● | 10 |
| VT1 | VT1 | ● | ● | 11 |

※ ○ JUDGED AS ON ● JUDGED AS OFF

| CH2 | CH1 | FIRST READING OPERATION | SECOND READING OPERATION | THIRD READING OPERATION | FOURTH READING OPERATION | FIFTH READING OPERATION | SIXTH READING OPERATION | OUTPUT DATA |
|---|---|---|---|---|---|---|---|---|
| VT0 | VT0 | ○ | ○ | ○ | ○ | ○ | ○ | 0000 |
| VT0 | VT1 | ○ | ○ | ○ | ○ | ○ | ● | 0001 |
| VT0 | VT2 | ○ | ○ | ○ | ○ | ● | ● | 0010 |
| VT0 | VT3 | ○ | ○ | ○ | ● | ● | ● | 0011 |
| VT1 | VT0 | ● | ○ | ○ | ○ | ○ | ○ | 0100 |
| VT1 | VT1 | ● | ○ | ○ | ○ | ○ | ● | 0101 |
| VT1 | VT2 | ● | ○ | ○ | ○ | ● | ● | 0110 |
| VT1 | VT3 | ● | ○ | ○ | ● | ● | ● | 0111 |
| VT2 | VT0 | ● | ● | ○ | ○ | ○ | ○ | 1000 |
| VT2 | VT1 | ● | ● | ○ | ○ | ○ | ● | 1001 |
| VT2 | VT2 | ● | ● | ○ | ○ | ● | ● | 1010 |
| VT2 | VT3 | ● | ● | ○ | ● | ● | ● | 1011 |
| VT3 | VT0 | ● | ● | ● | ○ | ○ | ○ | 1100 |
| VT3 | VT1 | ● | ● | ● | ○ | ○ | ● | 1101 |
| VT3 | VT2 | ● | ● | ● | ○ | ● | ● | 1110 |
| VT3 | VT3 | ● | ● | ● | ● | ● | ● | 1111 |

※ ○ JUDGED AS ON  ● JUDGED AS OFF

FIG. 16

NON-VOLATILE SEMICONDUCTOR DEVICE AND NON-VOLATILE SEMICONDUCTOR MEMORY DEVICE FOR STORING MULTI-VALUE INFORMATION

BACKGROUND OF THE INVENTION

This invention relates to a non-volatile semiconductor device, and in particular, to a non-volatile semiconductor device for inputting and outputting multi-value information for one memory cell.

Figure 1:
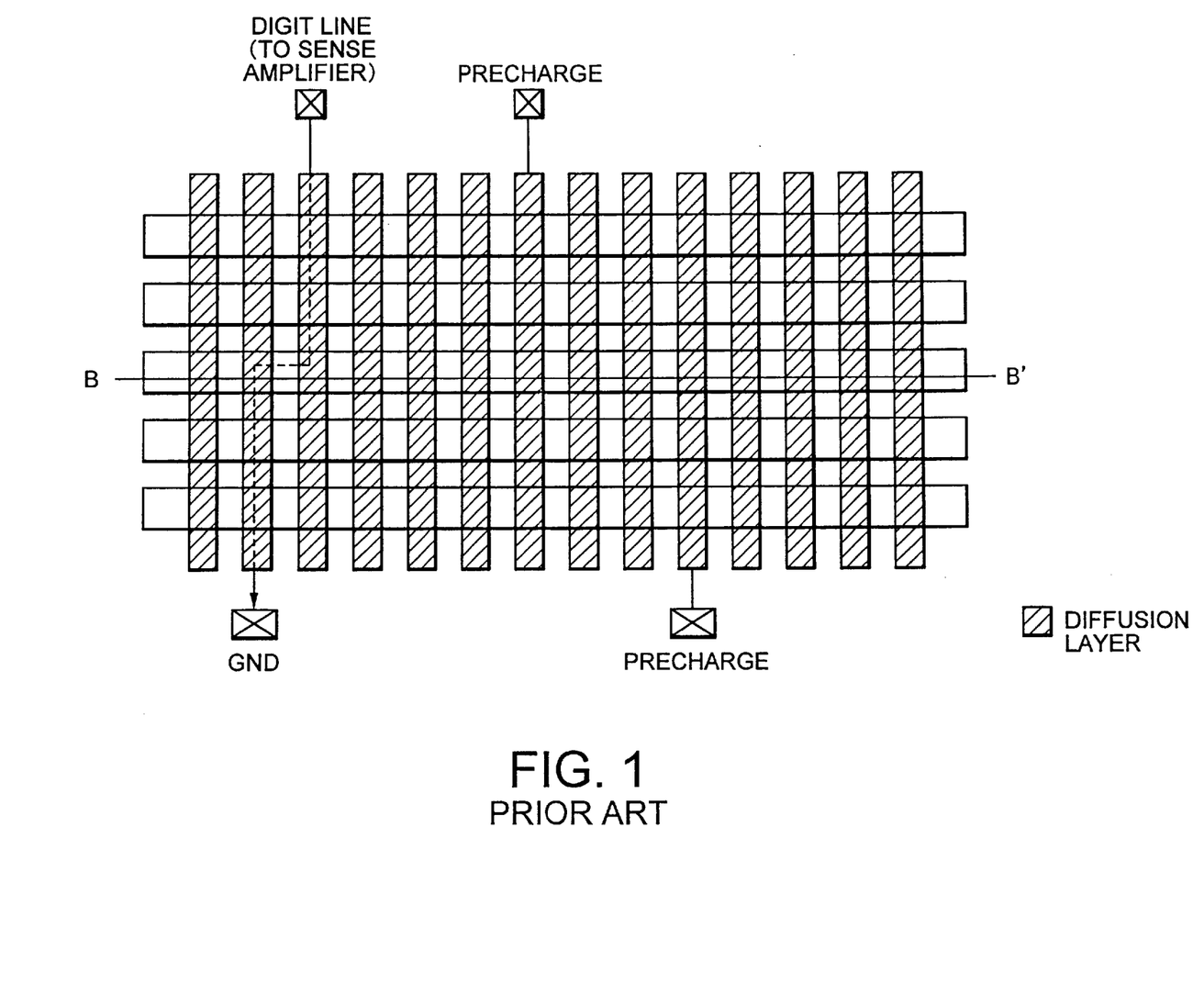
FIG. 1 is a diagram showing the conventional memory cell portion.
Figure 2:
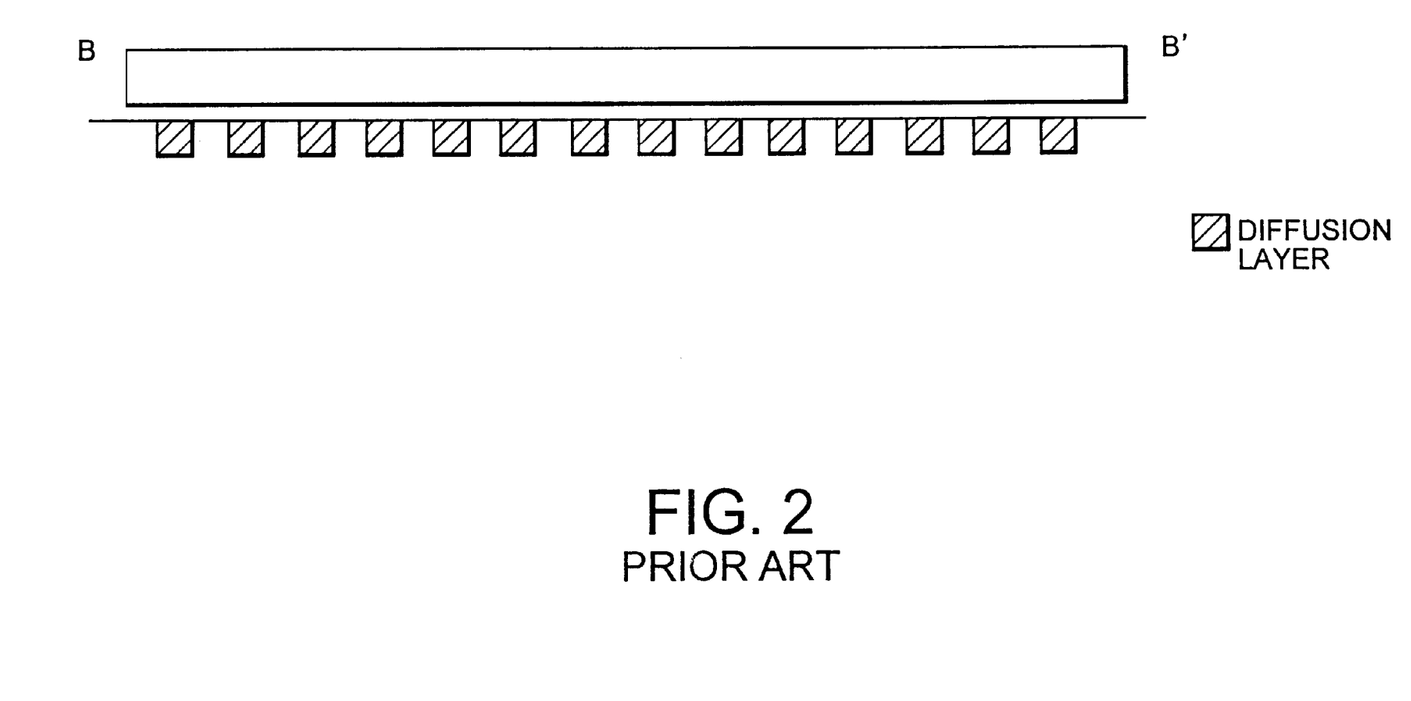
FIG. 2 is a cross sectional view, taken along B–B" line in FIG. 1.
Figure 3:
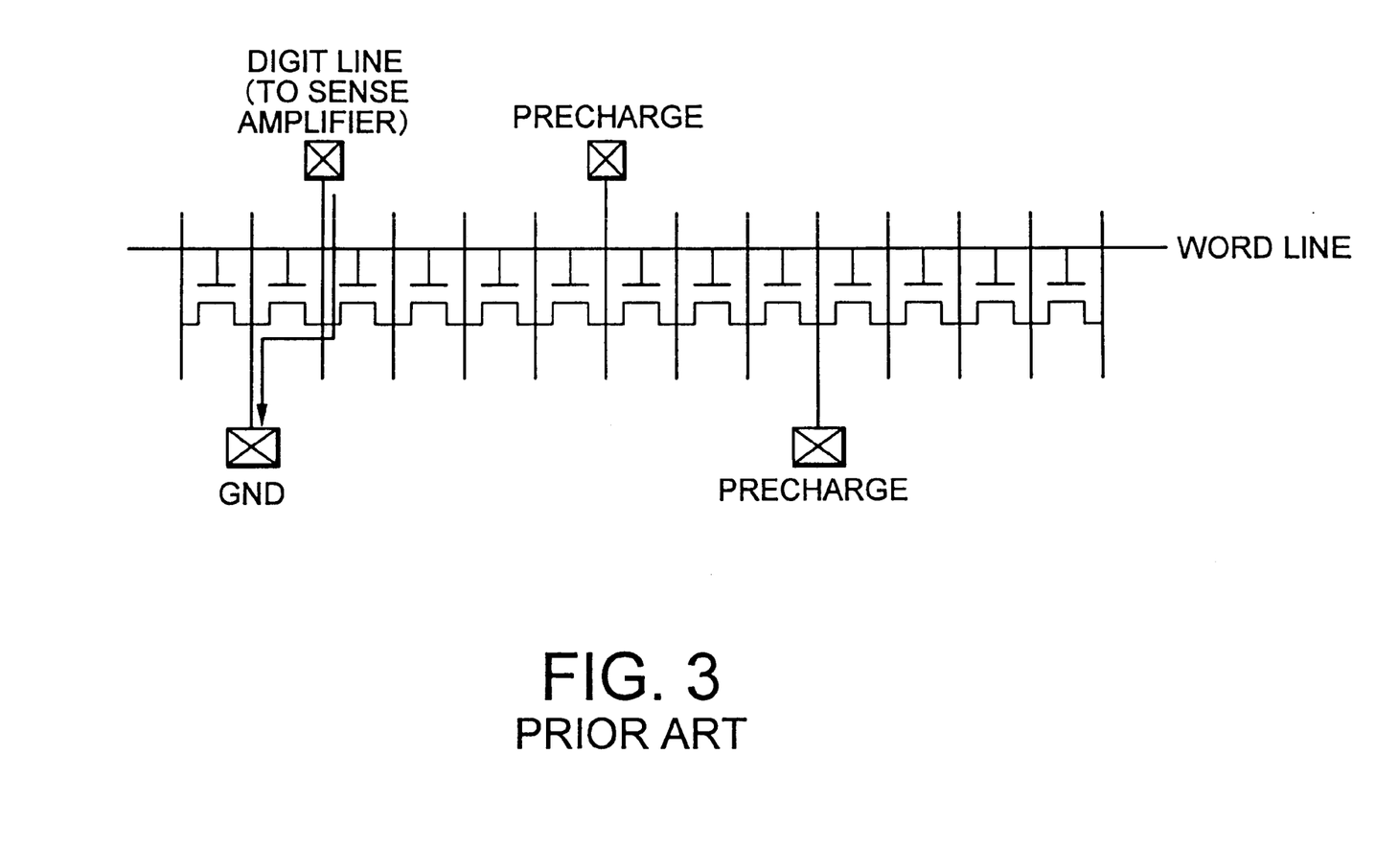
FIG. 3 is a circuit diagram of the memory cell portion illustrated in FIG. 1.

Referring to FIG. 1 through FIG. 3, description will be made about a structure of a related non-volatile memory cell.

Generally, when multi-value information of one bit or more is stored for a non-volatile memory cell, many kinds of threshold values are prepared for a channel portion of a transistor.

During a reading operation, the kind of the threshold value given to the memory cell is detected, and the multi-value information is obtained by logically calculating the detected result.

Figure 4:
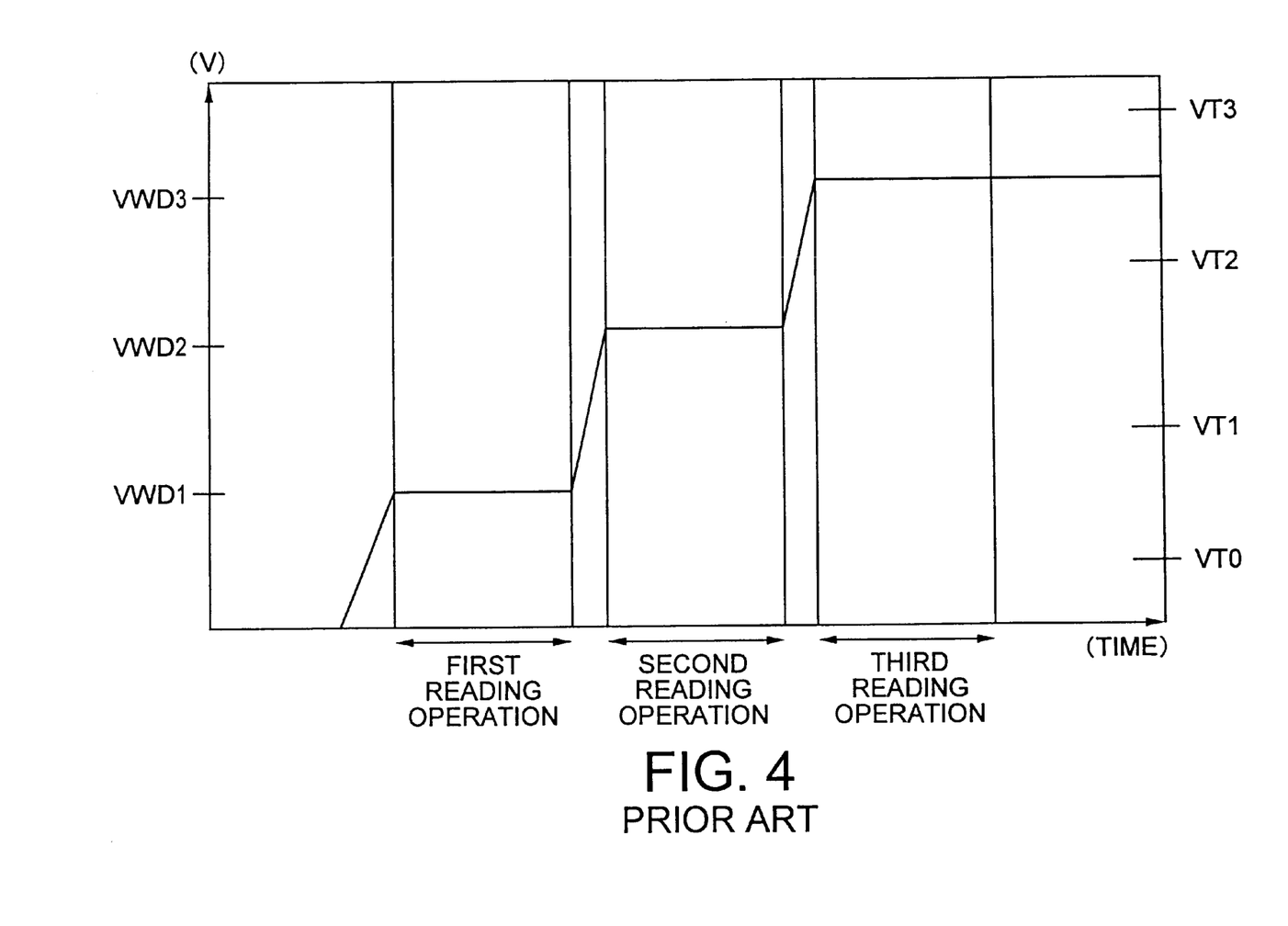
FIG. 4 is a diagram for explaining an operation for reading out 2-bits information from the conventional memory cell portion.

Referring to FIG. 4, description will be made about an example of a reading operation when 2-bit information is stored for one memory cell.

Four kinds of threshold values are prepared as VT0, VT1, VT2, and VT3 to store the 2-bit information for the memory cell.

On the other hand, setting values of gate voltages are defined as VWD1, VWD2 and VWD3, respectively. In this event, the relationship between the gate voltages and the threshold values is defined as the following equation (1).

$$0<VT0<VWD1<VT1<VWD2<VT2<VWD3<VT3 \quad (1)$$

Further, a sense-amplifier circuit detects an ON state when a current flows through the memory cell while it detects an OFF state when no current flows through the memory cell.

Now, it is assumed that the threshold value of the memory cell to be read is defined as VT1.

First, the gate voltage is set to VWD1 in a first reading operation. At this time, the memory cell is not in a conductive state because the threshold value of the memory cell is equal to VT1. Accordingly, the judgement becomes OFF.

Subsequently, the gate voltage is set to VWD2 in a second reading operation. Consequently, the gate voltage reaches a higher level than the threshold value VT1 in the memory cell, and the memory cell is put into the conductive state. As a result, the judgement becomes ON.

Next, the gate voltage is set to VWD3 in a third reading operation. In this case, the judgement also becomes ON.

The above-mentioned judgement results of the first to third reading operations are logically calculated to determine an output data.

Figure 5:
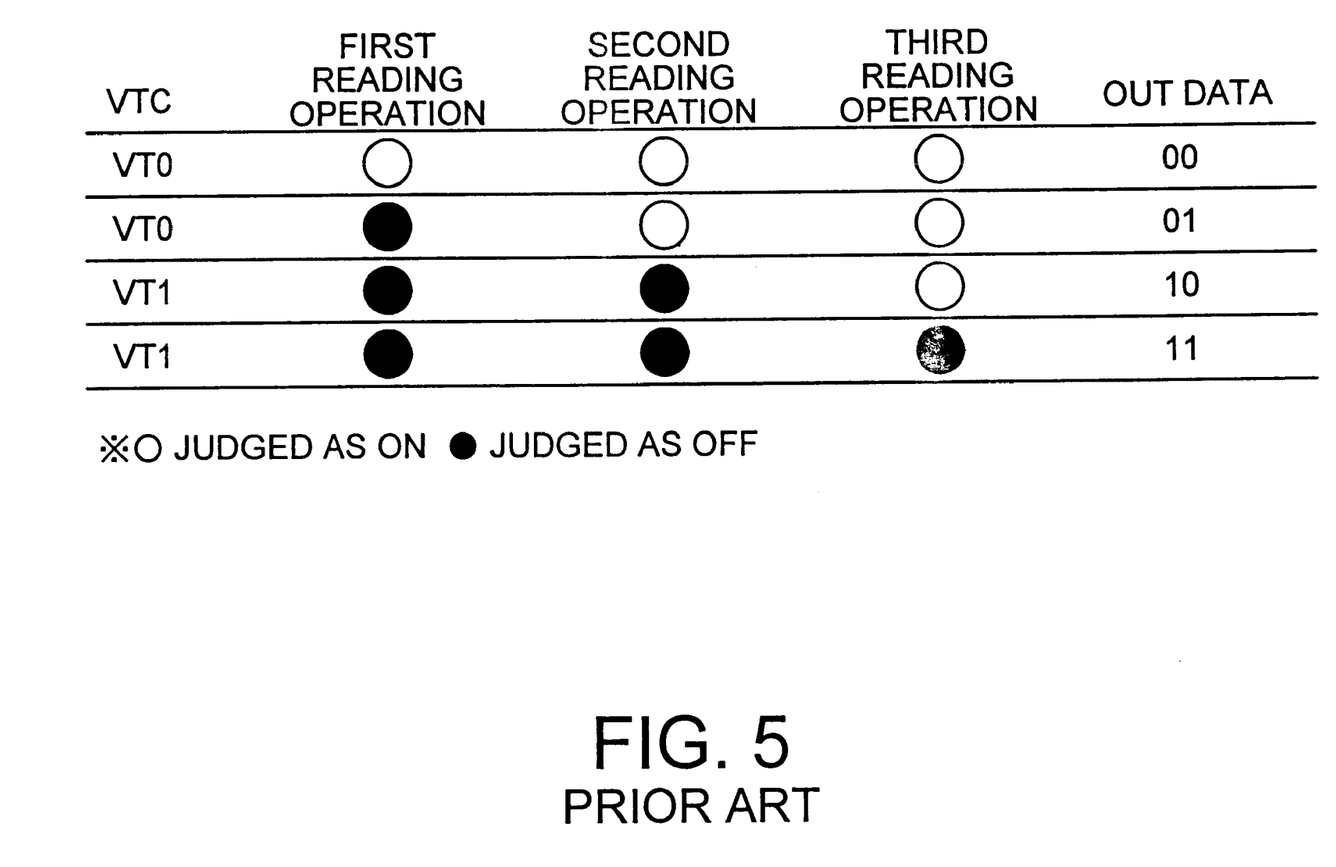
FIG. 5 is a diagram for explaining a corresponding relationship between reading results and output values when 2-bits information is read out from the conventional memory cell portion.

As illustrated in FIG. 5, output information (OUT DATA) is assigned for the threshold value of each memory cell. Thereby, 2-bits information is stored for one memory cell.

Figure 6:
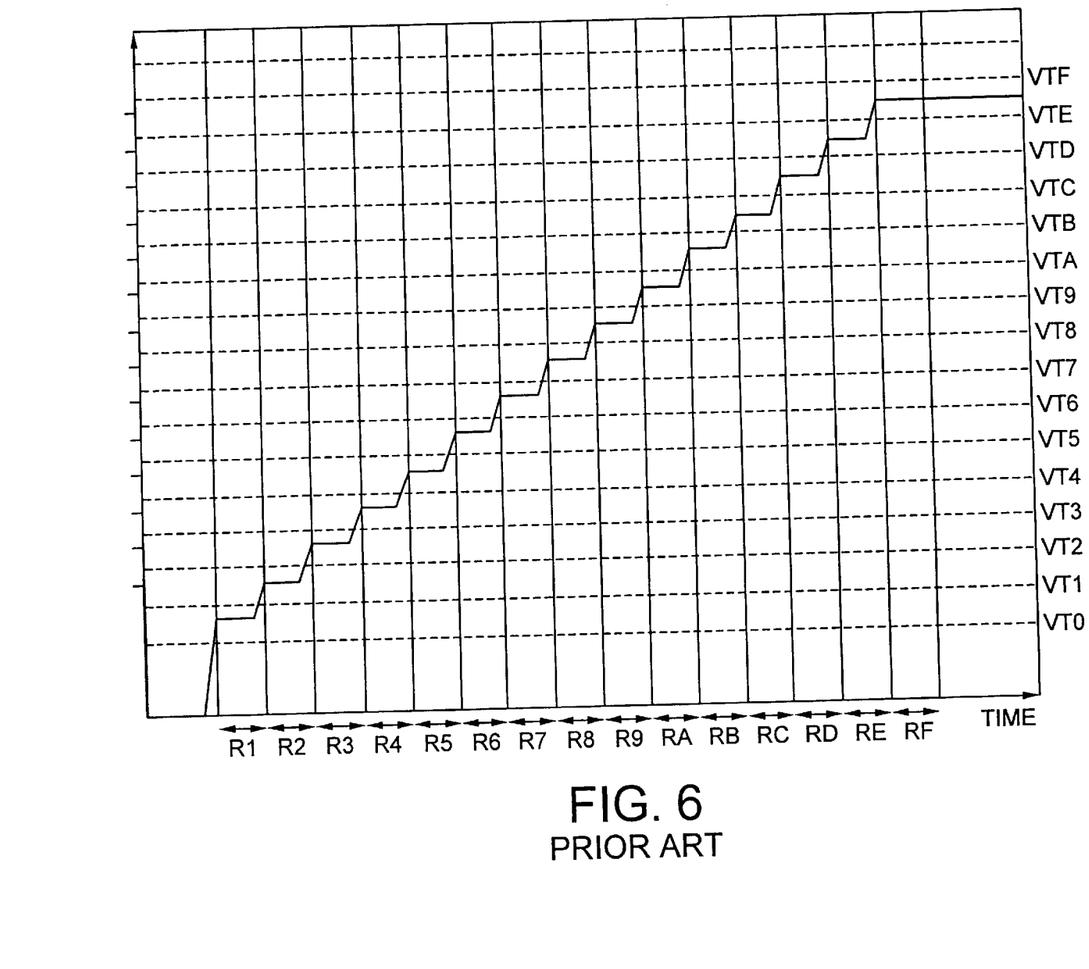
FIG. 6 is a diagram for explaining an operation for reading out 4-bits information from the conventional memory cell portion.
Figure 7:
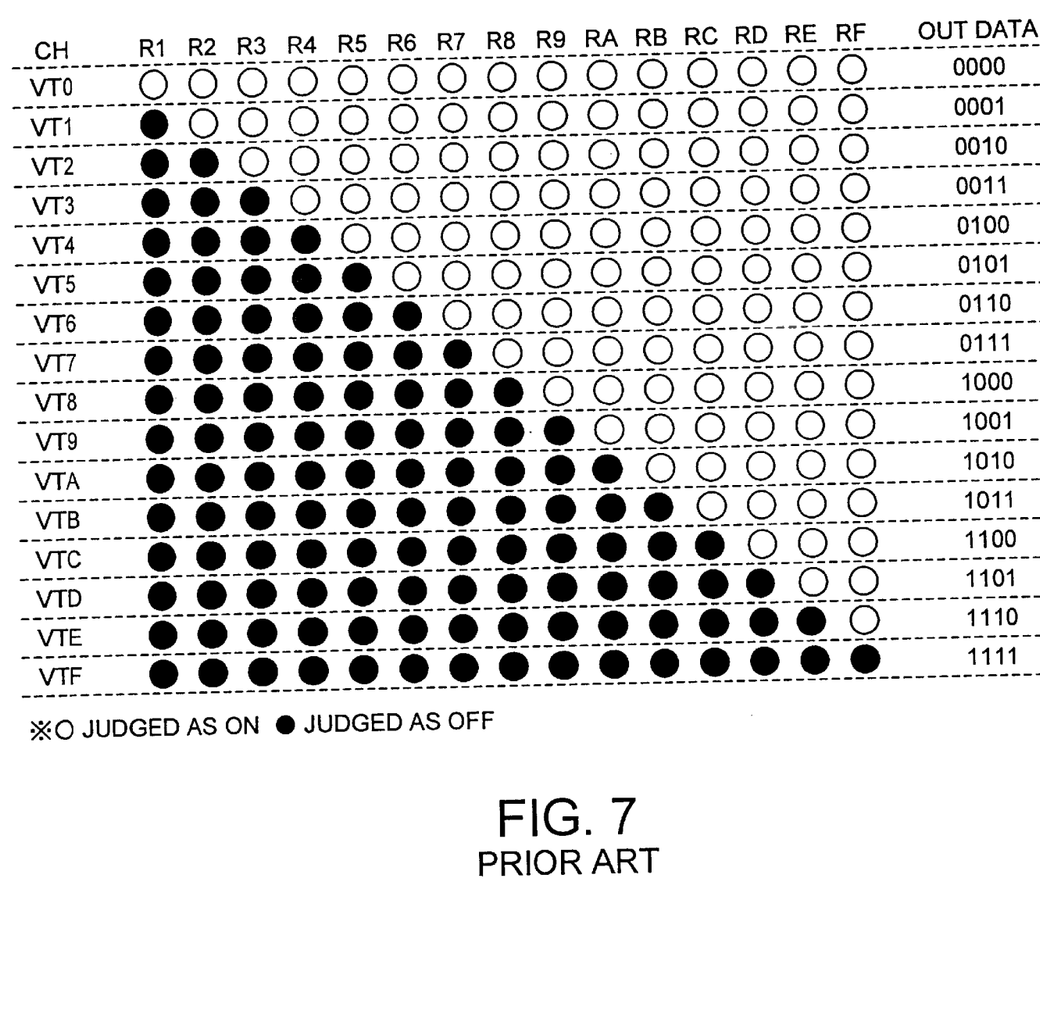
FIG. 7 is a diagram for explaining a corresponding relationship between reading results and output values when 4-bits information is read out from the conventional memory cell portion.

Similarly, description will be made about such a case that 4-bits information is stored for one memory cell with reference to FIGS. 6 and 7.

When 4-bits output information is stored, the number of the threshold values of the memory cell is equal to 16, and the reading number (namely, the gate switching number) is equal to 15.

In general, when the conventional non-volatile memory has the multi-value n, the necessary threshold number (NTV) and the gate voltage switching number (GNV) are represented by the following equations, respectively.

$$NTV=n^2 \quad (2)$$

$$GNW=NTV-1 \quad (3)$$

More specifically, when the output information to be stored for one memory cell is changed from 2 bits to 4 bits, the threshold number is changed from 4 to 16. At the same time, the reading number is changed from 3 to 15.

To this end, it is actually impossible to store further more output information in the conventional non-volatile memory cell.

Moreover, when ON bits continuously appears along the same word line (gate) direction in the memory cell illustrated in FIGS. 1 through 3, a current (IL1) inevitably flows in a direction of an adjacent cell even when a selective memory has an OFF bit.

In this event, the ON bit corresponds to a cell which can flow the current while the OFF bits corresponds to a cell which can not flow the current.

To solve such a problem, a pre-charge technique is necessary to read out the OFF bit. Consequently, the conventional non-volatile semiconductor device must have a complex logic circuit for the pre-charge. As a result, the number of devices constituting the apparatus becomes high.

In addition, even the pre-charge is carried out, the current (IL1) is not completely eliminated. This phenomenon prevents an accurate operation of the sense-amplifier circuit for detecting a fine current.

Further, the threshold value is set by implanting ions into the memory cell illustrated in FIG. 1, and the number of diffusion layers (BN) for which the sense amplifier circuit charges by the information (threshold value) of the adjacent cell with respect to the selective cell is different. Thereby, the difficulty of transient design inevitably increases.

SUMMARY OF THE INVENTION

It is therefore an object of this invention to provide to a non-volatile semiconductor device which is capable of reducing the switching number of a gate voltage by decreasing the necessary number of threshold values when a multi-value information is read out from the non-volatile memory cell.

It is another object of this invention to provide a non-volatile semiconductor device in which a pre-charge technique is not required.

It is still another object of this invention to provide a non-volatile semiconductor device which is capable of reducing the difficulty of transient design of the non-volatile semiconductor device using a multi-value technique.

According to this invention, a non-volatile semiconductor device stores multi-value information of at least two bits in one memory cell.

In this case, a source region and a drain region serve as diffusion regions. Further, a first channel region and a second channel region are placed between the source region and the drain region.

A first gate electrode is arranged over the first channel region and the drain region. A second gate electrode is arranged over the second channel region and the source region.

With such a structure, the first channel region stores a first threshold value while the second channel region stores a second threshold value different from the first threshold value.

In this event, the first and second threshold values may be independently given to the first and second channel regions by implanting ions.

Herein, the first and second threshold values are independently given to the first and second channel regions in a order to produce combinations of the first and second threshold values as the multi-value information.

According to this invention, a non-volatile semiconductor memory device stores multi-value information of at least two bits in one memory cell.

In this case, a plurality of first word lines are placed in a horizontal direction while a plurality of diffusion layers are placed in a perpendicular direction for the first word lines.

Further, a plurality of second word lines are alternately placed so as to cover the diffusion layers.

A first channel region is arranged under the first word line and between adjacent diffusion lines and stores a first threshold value.

On the other hand, a second channel region is arranged under the second word line and between the adjacent diffusion lines and stores a second threshold value different from the first threshold value.

Moreover, a sense amplifier is coupled to at least one of the diffusion layers and produces combinations of the first and second threshold values as the multi-value information.

With this structure, each of the diffusion lines has a first width while each of the second word lines has a second width.

Under such a circumstance, the second width may be wider than the first width.

Further, a ground is preferably coupled to at least one of the diffusion lines.

In this event, the diffusion line serves as any one of a source region and a drain region while the first word line serves as a first gate electrode over the drain region and the first channel region. Further, the second word line serves as a second gate electrode over the source region and the second channel region.

The first and second threshold values may be independently given to the first and second channel regions by implanting ions.

The sense amplifier gives a voltage for any one of the first and second gate electrodes such that the corresponding channel region is always in a conductive state irrelevant of the stored threshold value, and produces the combinations of the first and second threshold values as the multi-value information by gradually changing a voltage of the other gate electrode.

For example, the sense amplifier gives the voltage for the first gate electrode such that the first channel region is always in a conductive state irrelevant of the first threshold value, and judges the second threshold value stored in the second channel region by gradually changing the voltage given to the second gate electrode.

Further, the sense amplifier gives the voltage for the second gate electrode such that the second channel region is always in a conductive state irrelevant of the second threshold value, and judges the first threshold value stored in the first channel region by gradually changing the voltage given to the first gate.

DESCRIPTION OF PREFERRED EMBODIMENT

Figure 8:
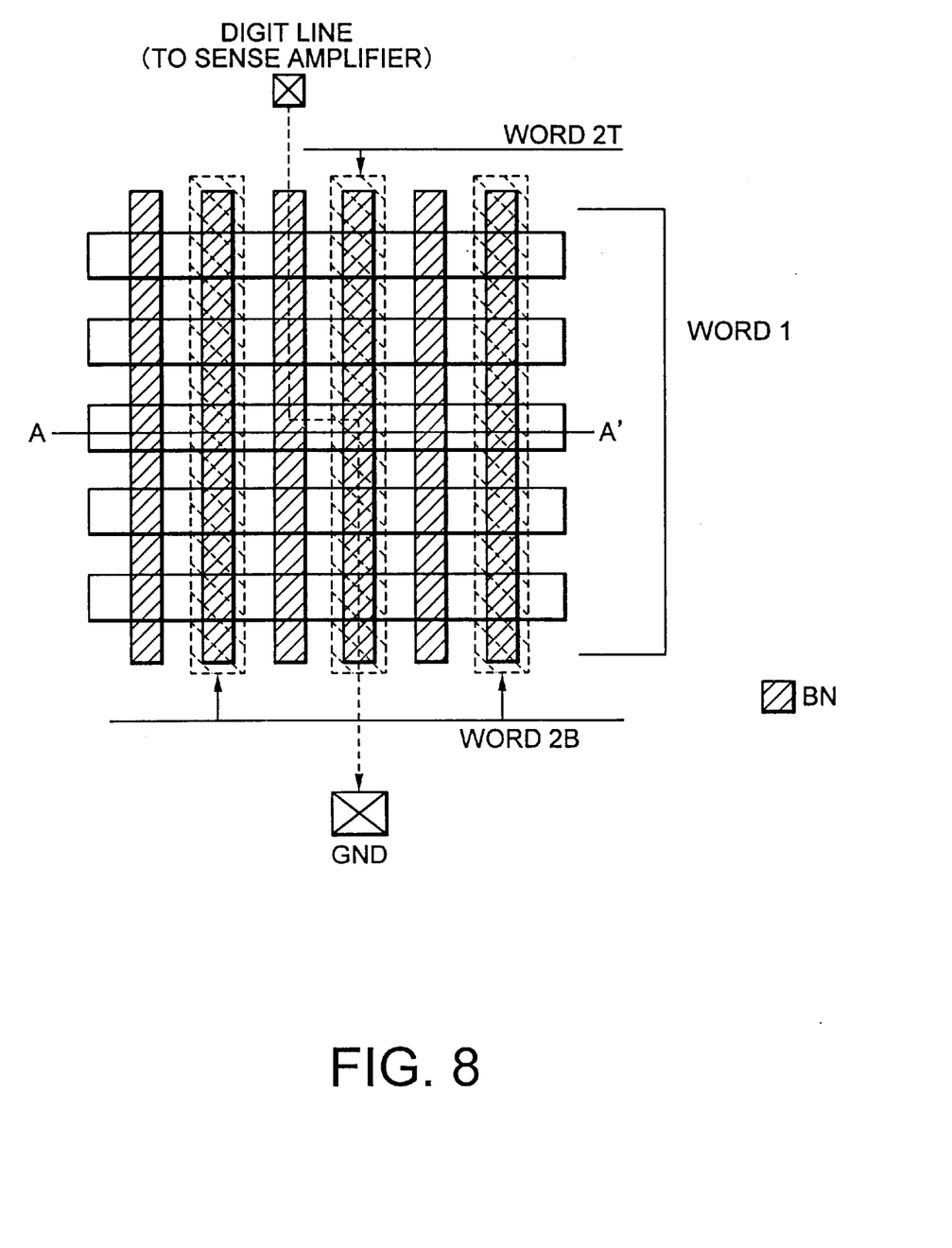
FIG. 8 is a diagram showing a structure of a memory cell portion according to an embodiment of this invention.
Figure 9:
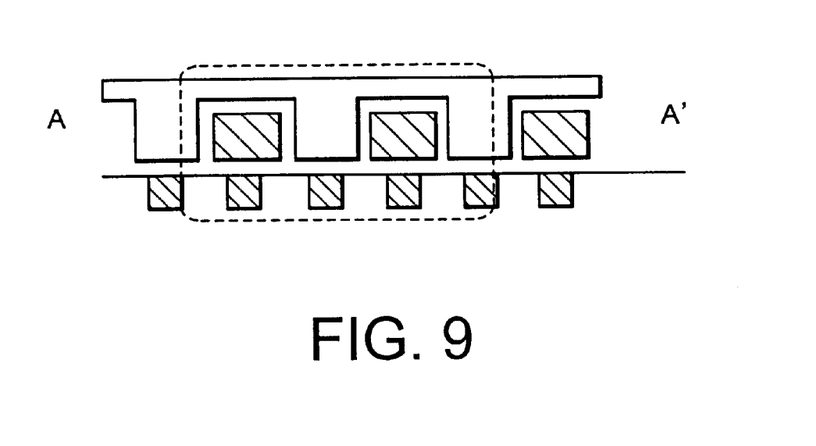
FIG. 9 is a cross sectional view, taken along A–A' line in FIG. 8.

Referring to FIG. 8, description will be made about a structure of a memory cell according to an embodiment of this invention.

Herein, it is to be noted that BN represents a diffusion layer serving as a source region or a drain region of a transistor. First gate electrodes WORD 1 are formed in a perpendicular direction for BN so as to cross with a plurality of BNs.

Further, second gate electrodes WORD2T and WORD2B are formed directly over the diffusion layer serving as the source region of the memory cell. Moreover, the second gate electrode has a width wider than BN, and are placed so as to cover BN.

Figure 10:
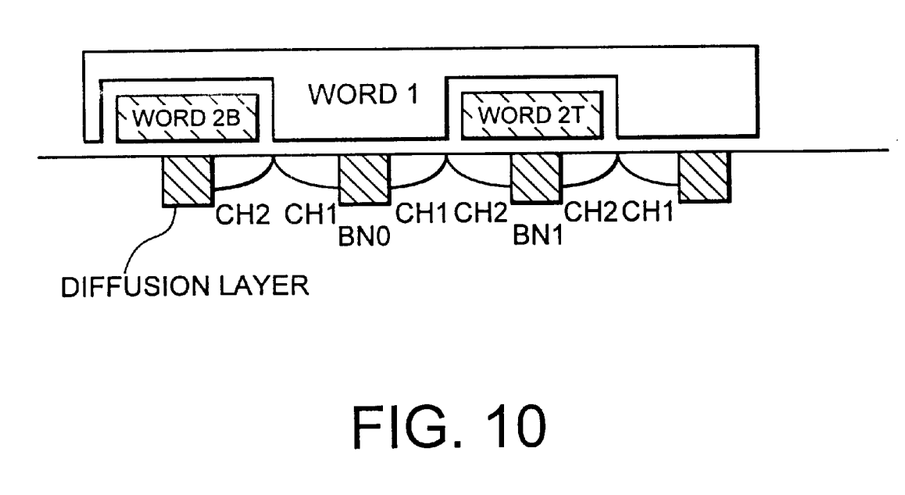
FIG. 10 is an enlarged diagram of a dot-line portion in FIG. 9.
Figure 11:
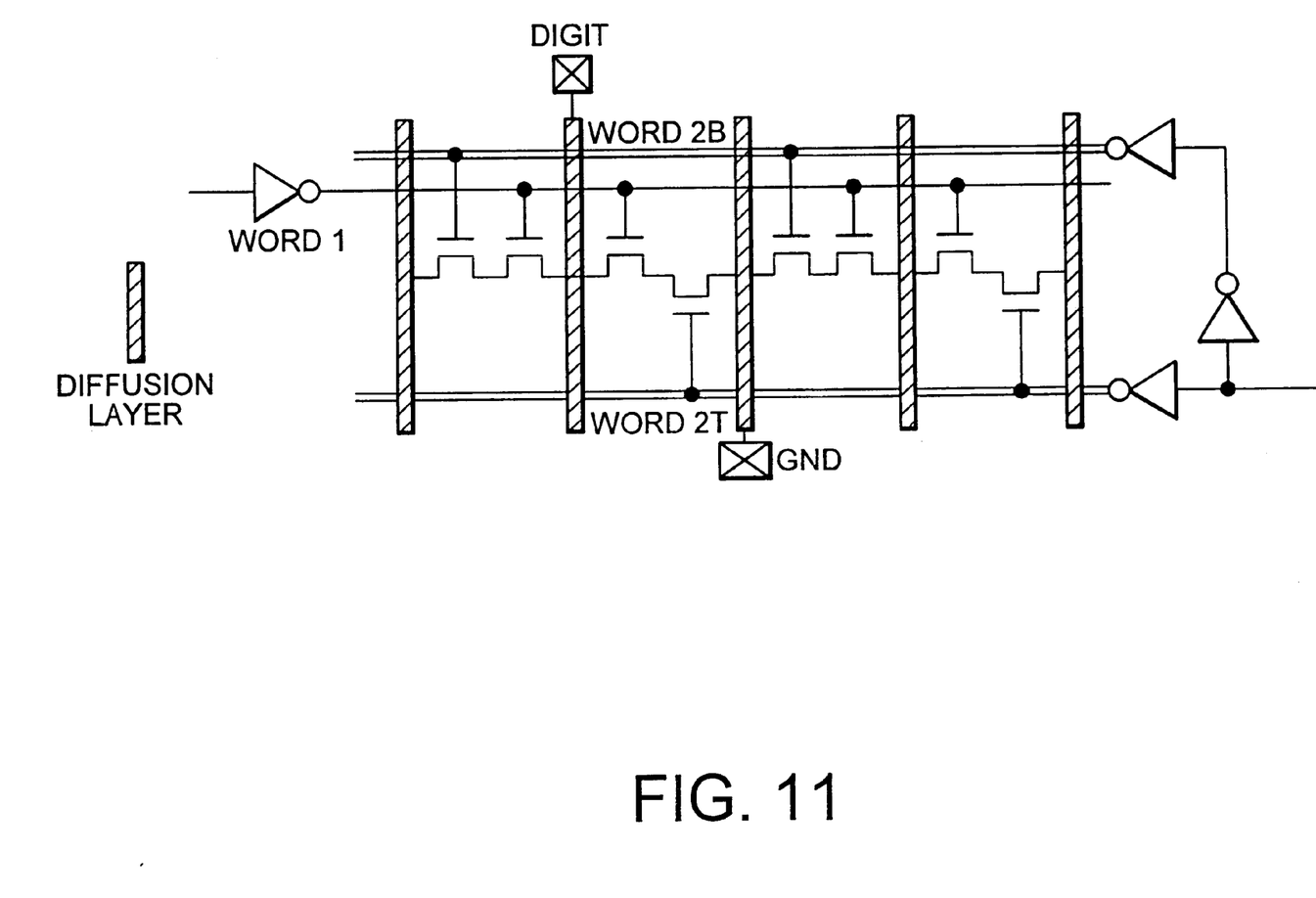
FIG. 11 is a circuit diagram showing a memory cell portion illustrated in FIG. 8.

In FIG. 10, the source of the memory cell corresponds to BN1, and the second gate electrode WORD 2T is formed directly over BN1 and on a second channel region (CH2).

Further, the first gate electrode WORD 1 is formed directly over BN0 serving as the drain of the memory cell and on a first channel region (CH1).

In this case, ions may be implanted for the channel regions CH1 and CH2 placed between BN0 and BN1 to independently obtain the threshold values.

Subsequently, description will be made about the operation * of the memory cell when 2-bits information is stored for one memory cell with reference to FIG. 13.

Now, the threshold value of CH1 is defined as VT0 (0V<VT0<½VCC) while the threshold value of CH2 is defined as VT1 (½VCC<VT1<VCC).

The sense amplifier circuit judges as an ON state when the current flows from BN0 to BN1 during the reading operation while it judges as an OFF state when no current flows.

Figure 12:
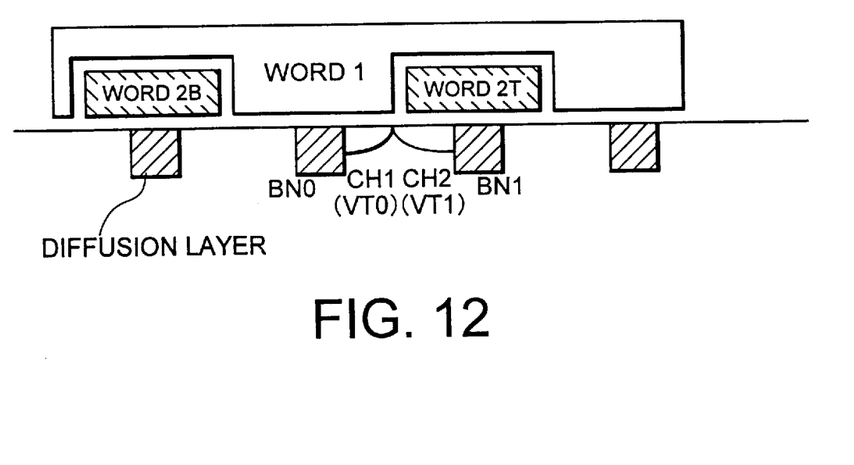
FIG. 12 is a diagram for explaining a state in which a threshold value is given to a memory cell portion illustrated in FIG. 10.
Figure 13:
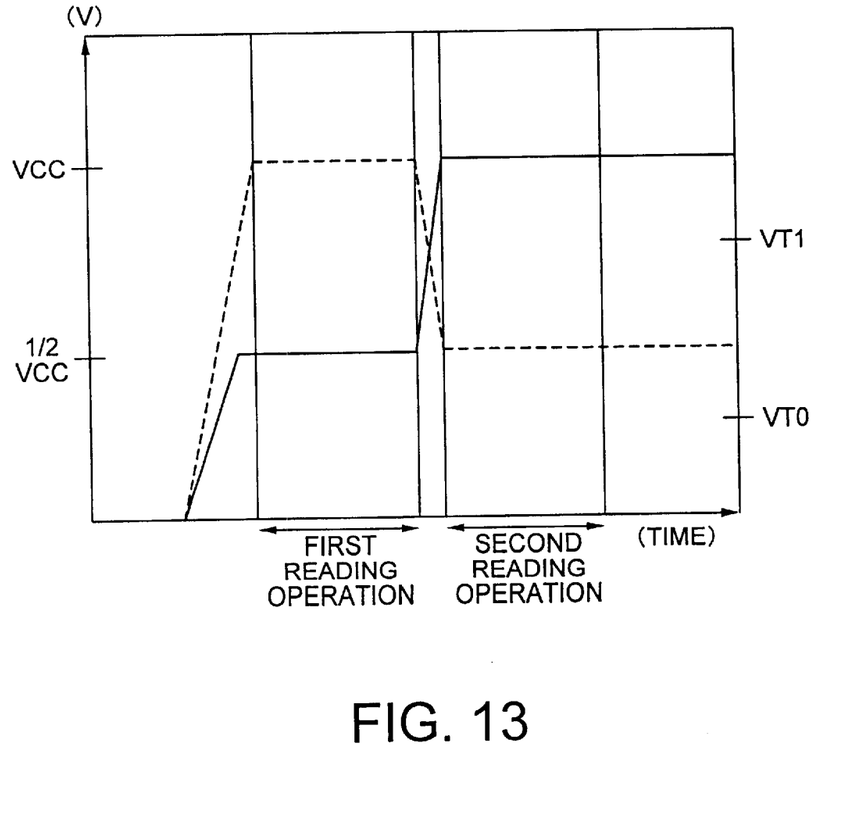
FIG. 13 is a diagram for explaining an operation of WORD 1 and WORD 2 when 2-bits information is read out from a memory cell portion of this invention.

In this case, the operation of WORD 1 and WORD 2 is shown in FIG. 13 when the memory cell illustrated in FIG. 12 is read out. Herein, a vertical axis represents a voltage while an abscissa axis represents time.

In FIG. 13, the WORD 1 is set to a VCC level during a first reading time. Under this circumstance, each of VT0 and VT1 has a lower level than VCC. Consequently, the region of CH1 is in a conductive state.

In this condition, the level of WORD2T is set to ½VCC. In this event, no current flows from BN0 towards BN1 because the threshold value of the CH2 is equal to VT1. In consequence, the sense amplifier judges as the OFF state.

During a second reading time, the WORD 1 is changed to the level of ½VCC, and the WORD2T is changed to the level of VCC. Like the first reading time, the CH2 region is in a conductive state because the threshold value of CH2 is lower than VCC.

In this event, the threshold value of CH1 is equal to VT0, and is lower than ½VCC. Therefore, the CH1 region is in the conductive state. As a result, the current flows from BN0 towards NB1, and the judgement becomes the ON state.

Although description has been so for made about the WORD2T as an example, the operation is the same when the WORD2B is used. During the reading operation time, the voltage is applied to any one of WORD 2T and WORD2B.

Figure 14:
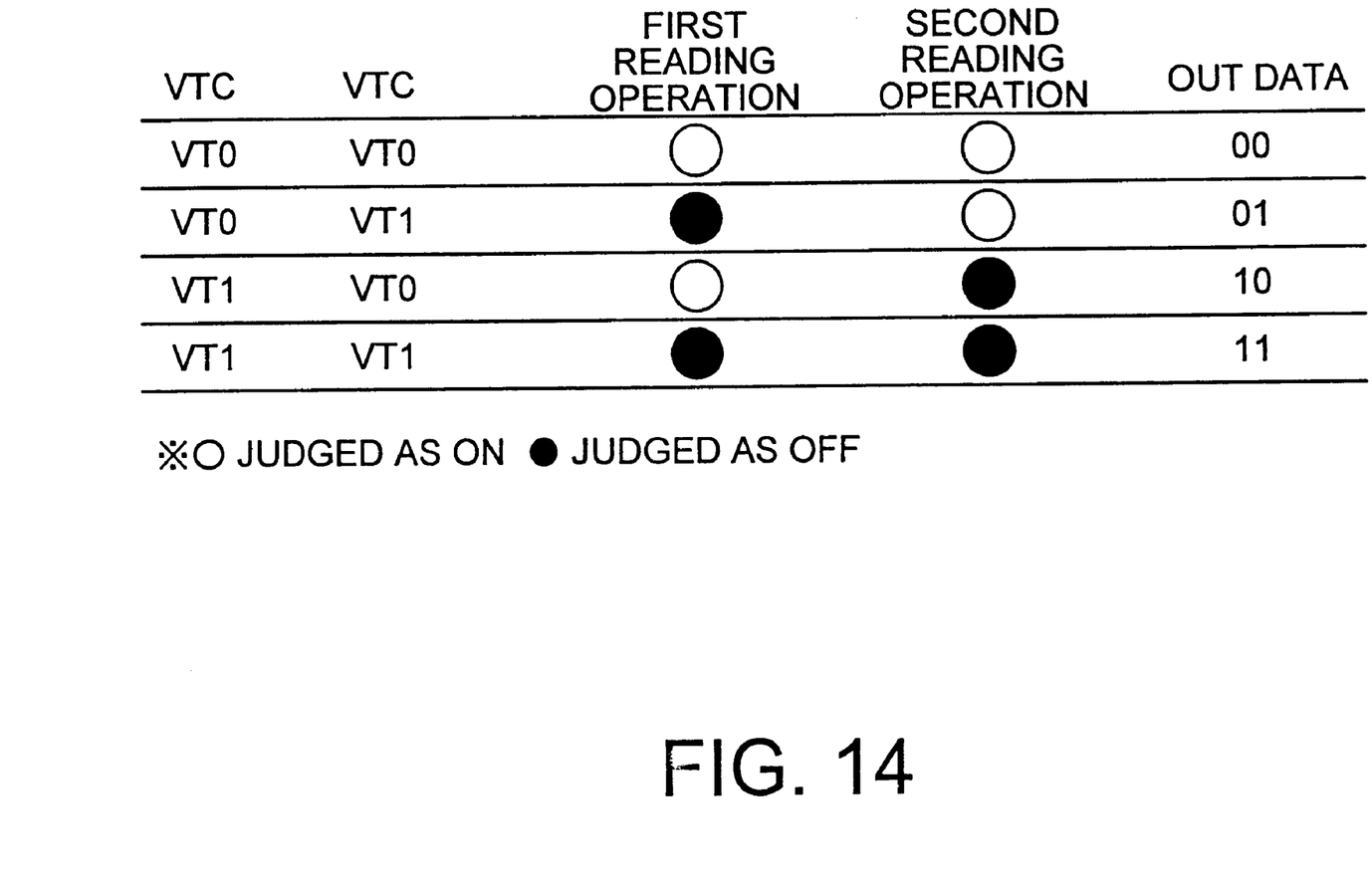
FIG. 14 is a diagram for explaining a corresponding relationship between combination of threshold values of CH1 and CH2 and output values when 2-bit information is read out from a memory cell portion of this invention.

In FIG. 14, reading results are shown when the threshold values of CH1 and CH2 are combined. As illustrated in FIG. 14, when the output data (OUT DATA) is assigned for the combination of the judgement results of the first and second reading operations, 2-bits data can be stored for one memor cell.

Subsequently, description will be made about the operation of the embodiment when 4-bits information is stored for one memory cell.

The four kinds of threshold value are set for CH1 and CH2 such that the information stored for one memory cell is changed from 2 bits to 4 bits. Further, the reading operation number is set to 6.

Under such a circumstance, the threshold values to be set for CH1 and CH2 are defined VT0, VT1, VT2,and VT3 while the voltages of WORD I, WORD2T,and WORD2B are defined as VWDO, VWD1, VWD2,and VWD3.

In this case, the relationship between the threshold values and the gate voltages is represented by the following quotation (4).

$$0<VT0<VWD0<VT1<VWD1<VT2<VWD2<VT3<VWD3 \quad (4)$$

In this event, the reading operation will be explained with reference to FIG. 15 when the threshold value of CH1 is defined as VT1 and the threshold value of CH2 is defined as VT2.

Figure 15:
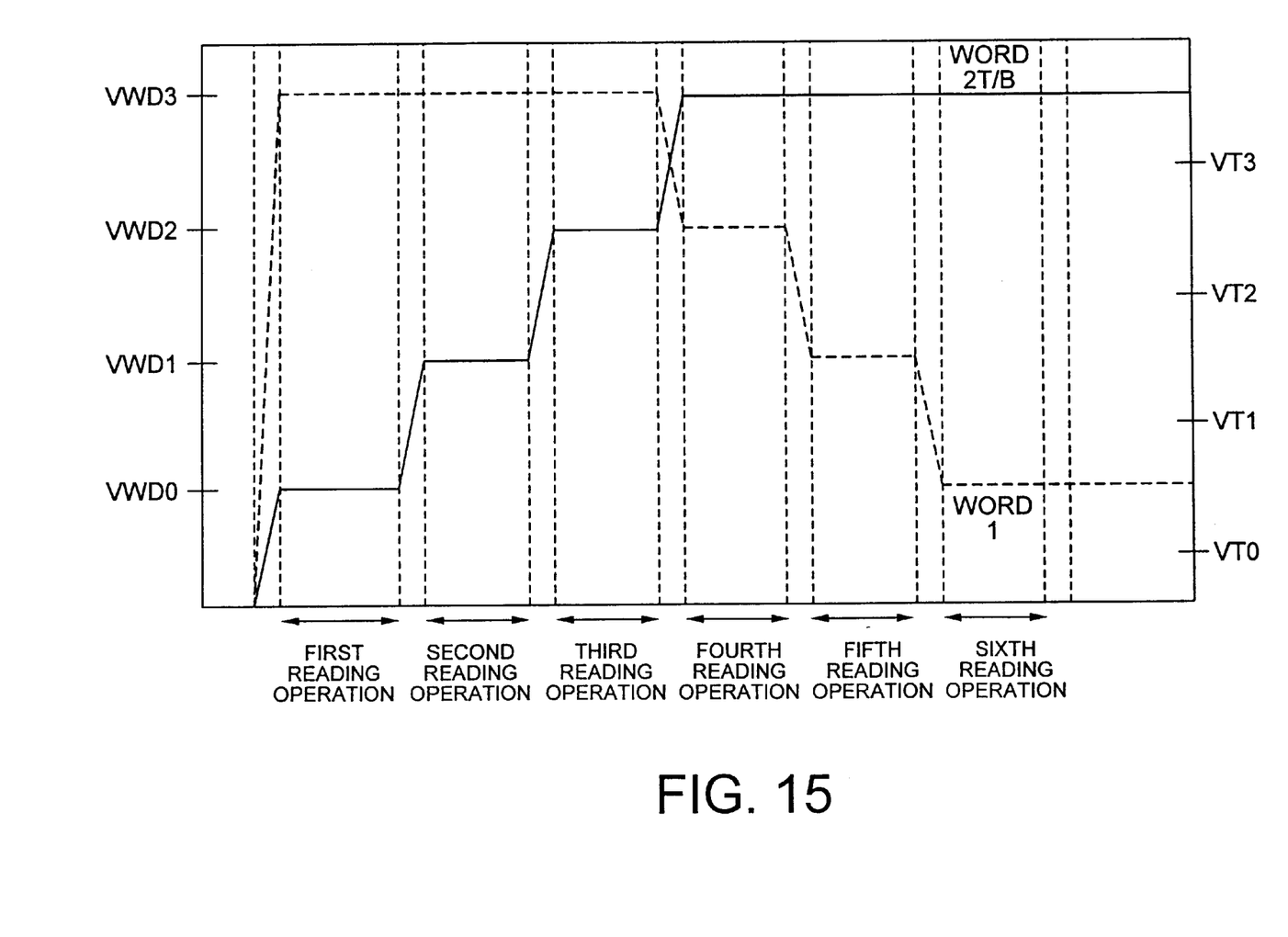
FIG. 15 is a diagram for explaining an operation of WORD 1 and WORD 2 when 4-bits information is read out from a memory cell portion of this invention.

In FIG. 15, the level of WORD 1 is represented by a dot line while the level of WORD2T (or WORD2B) is represented by a solid line.

First, the level of WORD 1 is set to VWD3 between the first reading time and the third reading time. The CH1 portion is in the conductive state between the first reading time and the third reading time because VWD3 has a level higher than VT3.

In this state, the level of WORD2T is gradually changed. During the first reading time, WORD2T is set to the level of VWD0. Now, the threshold value of CH2 is higher than VWD0. Consequently, no current flows through the memory cell, and the judgement is kept to the OFF state.

During the second reading time, the level of WORD2T is set to VWD1. In this event, no current flows through the memory cell, and the judgement becomes the OFF state.

During the third reading time, the level of WORD2T is set to VWD2. In this case, the threshold value of CH2 is lower than VWD2. In consequence, the current flows through the memory cell, and the judgement becomes the ON state.

Subsequently, the level of WORD2T is set to VWD3 during the fourth reading time and the sixth reading time.

The CH2 region is in the conductive state between the fourth reading time and the sixth reading time because the threshold value of CH2 is equal to VT2

During the fourth reading time, the level of WORD 1 is set to VWD2. The threshold value of CH1 is equal to VT1. Consequently, the current flows through the memory cell, and the judgement becomes the ON state.

Next, during the fifth reading time, the level of WORD 1 is set to VWD 1. In this case, the gate voltage is higher than the threshold value of CH1. Thereby, the current flows through the memory cell, and the judgement becomes ON state.

Subsequently, the level of WORD 1 is set to VWD0 during the sixth reading time, no current flows through the memory cell because the CH1 portion is cut off. Therefore, the judgement becomes the OFF state during the sixth reading time.

Thus, the level of the WORD 1 is fixed to VWD3 between the first reading time and the third reading time, and the level of WORD 2T is gradually changed.

Conversely, the level of WORD2T is fixed to VWD3 between the fourth reading time and the sixth reading time, and the level of WORD 1 is gradually changed.

Figure 16:
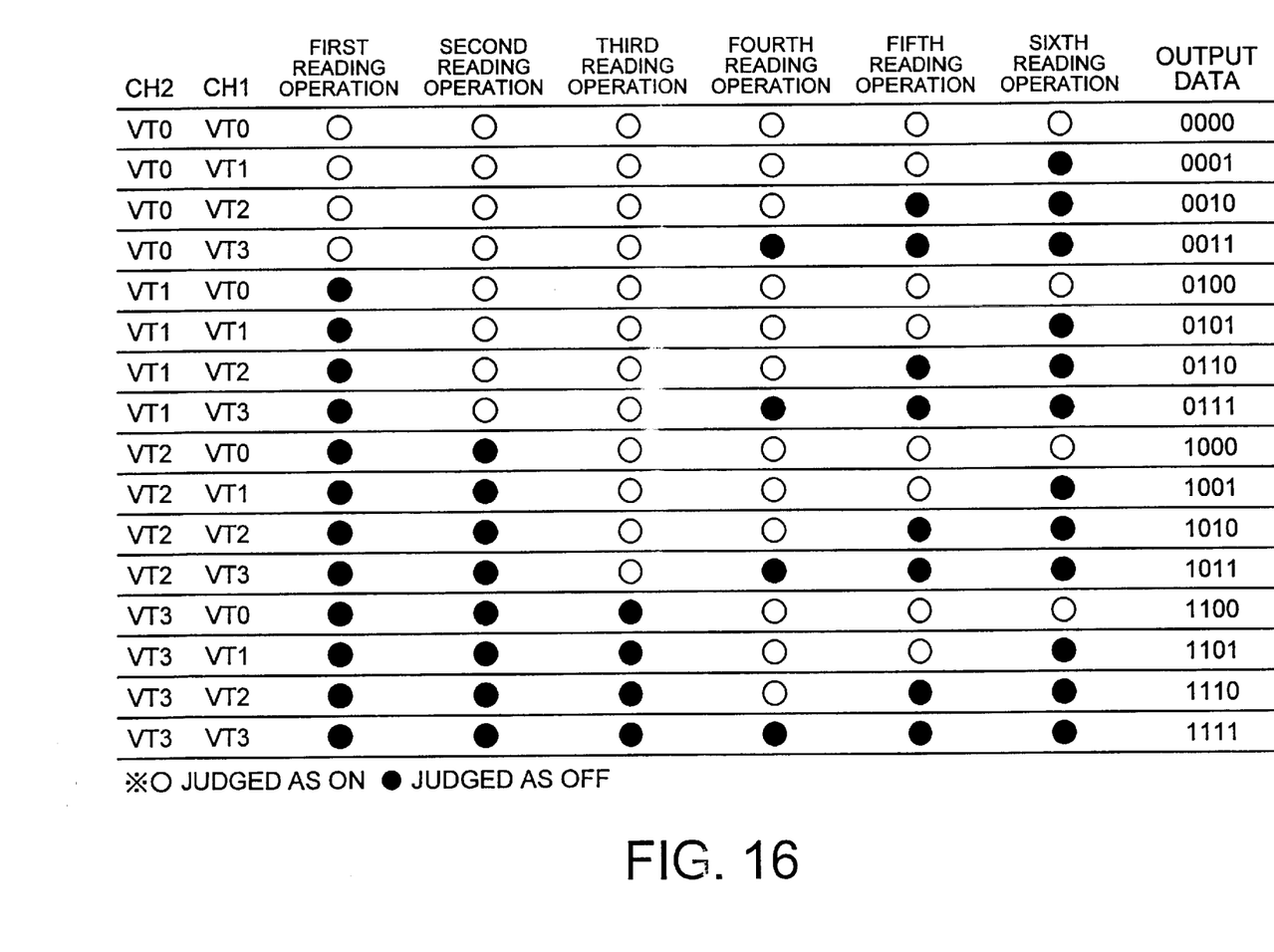
FIG. 16 is a diagram for explaining a corresponding relationship between combination of threshold values of CH1 and CH2 and output values when 4-bit information is read out from a memory cell portion of this invention.

As illustrated in FIG. 16, the output data is assigned for the judgement results during the first through sixth reading times. Thereby, the 4-bits data is stored for one memory cell.

As mentioned above, when the memory cell is used in this embodiment, the number (NTV) of the threshold values and the voltage switching number (GNW), which must be set to the memory cell having the multi-value n, are represented by the following equations (5) and (6).

$$NTV=n \quad (5)$$

$$GNW=(NTV-1)\times 2 \quad (6)$$

Thus, the number (kinds) of the threshold values can be reduced as compared the conventional case when many informations are stored for the one memory cell according to this invention.

Further, the information can be read out with the gate voltage switching number smaller than the conventional case. Consequently, a high-speed operation is possible. As a result, as the multi-value number is higher, it is more advantageous.

Moreover, the memory cell can be electrically cut off from the adjacent memory cell during a reading operation. In consequence, the circuit device, such as the pre-charge circuit and the GND selector can be eliminated or omitted.

In addition, the current pass towards the adjacent cell portion is always cut off. Thereby, the charge current does not flow for the diffusion layer capacitor except for the diffusion layer selected via the adjacent memory cell. Consequently, the memory cell can always and stably be operated.

While this invention has so far been disclosed in conduction with several embodiments thereof, it will be readily possible for those skilled in the art to put this invention into practice in various other manners.

What is claimed is:

1. A non-volatile semiconductor device which stores multi-value information of at least two bits in one memory cell, comprising:
    a source region and a drain region which serve as diffusion regions;
    a first channel region and a second channel region which are placed between the source region and the drain region;
    a first gate electrode formed of a first gate material layer which is arranged over the first channel region and substantially covers the drain region; and
    a second gate electrode formed of a second gate material layer different from the first gate material layer which is arranged over the second channel region and the source region;
    the first channel region storing a first threshold value while the second channel region storing a second threshold value different from the first threshold value.

2. A semiconductor device as claimed in claim 1, wherein:
    the first and second threshold values are independently set to predetermined values in the first and second channel regions by implanting ions.

3. A semiconductor device as claimed in claim 1, wherein:
    the first and second threshold values are independently set to predetermined values in the first and second channel regions in order to produce combinations of the first and second threshold values as the multi-value information.

4. A non-volatile semiconductor memory device which stores multi-value information of at least two bits in one memory cell, comprising:
    a plurality of substantially parallel first word lines disposed in a horizontal direction;
    a plurality of diffusion lines, having a first width, disposed in a direction substantially perpendicular to the first word lines;
    a plurality of second word lines having a second width larger than the first width, disposed to substantially cover at least alternate ones of the diffusion layers;
    a first channel region disposed under the first word line and between adjacent ones of the plurality of diffusion lines and which stores a first threshold value;
    a second channel region disposed under the second word line and between the adjacent diffusion lines and which stores a second threshold value different from the first threshold value; and
    a sense amplifier which is coupled to at least one of the diffusion layers and which produces combinations of the first and second threshold values as the multi-value information.

5. A semiconductor memory device which stores multi-value information of at least two bits in one memory cell, comprising:
    a plurality of first word lines which are placed in a horizontal direction;
    a plurality of diffusion layers which are placed in a perpendicular direction for the first word lines;
    a plurality of second word lines which are alternately placed so as to cover the diffusion layers;
    a first channel region which is arranged under the first word line and between adjacent diffusion lines and which stores a first threshold value
    a second channel region which is arranged under the second word line and between the adjacent diffusion lines and which stores a second threshold value different from the first threshold value; and
    a sense amplifier which is coupled to at least one of the diffusion layers and which produces combinations of the first and second threshold values as the multi-value information, wherein:
        each of the diffusion lines has a first width, and
        each of the second word lines has a second width, the second width being wider than the first width.

6. A semiconductor memory device as claimed in claim 4, further comprising;
    a ground voltage supply coupled to at least one of the diffusion lines.

7. A semiconductor memory device which stores multi-value information of at least two bits in one memory cell, comprising:
    a plurality of first word lines which are placed in a horizontal direction;
    a plurality of diffusion layers which are placed in a perpendicular direction for the first word lines;
    a plurality of second word lines which are alternately placed so as to cover the diffusion layers;
    a first channel region which is arranged under the first word line and between adjacent diffusion lines and which stores a first threshold value a second channel region which is arranged under the second word line and between the adjacent diffusion lines and which stores a second threshold value different from the first threshold value; and
    a sense amplifier which is coupled to at least one of the diffusion layers and which produces combinations of the first and second threshold values as the multi-value information, wherein:
        the diffusion line serves as any one of a source region and a drain region, the first word line serves as a first gate electrode over the drain region and the first channel region, and
        the second word line serves as a second gate electrode over the source region and the second channel region.

8. A semiconductor memory device as claimed in claim 4, wherein:
    the first and second threshold values are independently set to predetermined values in the first and second channel regions by implanting ions.

9. A semiconductor memory device as claimed in claim 4, wherein:
    the sense amplifier detects and determines a voltage for any one of the first and second gate electrodes such that the corresponding channel region is always in a conductive state irrelevant of the stored threshold value, and produces the combinations of the first and second threshold values as the multi-value information by gradually changing a voltage of the other gate electrode.

10. A semiconductor memory device as claimed in claim 9, wherein:
    the sense amplifier detects and determines the voltage for the first gate electrode such that the first channel region is always in a conductive state irrelevant of the first threshold value, and judges the second threshold value stored in the second channel region by gradually changing the voltage provided to the second gate electrode.

11. A semiconductor memory device as claimed in claim 10, wherein:

the sense amplifier detects and determines the voltage for the second gate electrode such that the second channel region is always in a conductive state irrelevant of the second threshold value, and judges the first threshold value stored in the first channel region by gradually changing the voltage provided to the first gate.

12. A method of reading-out multi-value information from a single memory cell of a non-volatile memory which has first and second channel regions between diffusion layers serving as source and drain regions, a first gate electrode disposed over the first channel region and a second gate electrode disposed over the second channel region, the first channel region having a first threshold value while the second channel region having a second threshold value, comprising the steps of;

judging the first and second threshold values stored in the first and second channel regions; and producing combinations of the first and second threshold values as the multi-value information read-out information.

13. A method as claimed in claim 12, wherein:

the judgement step including;

providing a voltage for the first gate electrode such that the first channel region is always in a conductive state irrelevant of the first threshold value, judging the second threshold value stored in the second channel region by gradually changing a voltage given for the second gate, providing the voltage for the second gate such that the second channel region is always in a conductive state irrelevant of the second threshold value, and judging the first threshold value stored in the first channel region by gradually changing the voltage provided to the first gate.

* * * * *